(12) United States Patent
Premerlani et al.

(10) Patent No.: US 9,810,730 B2
(45) Date of Patent: Nov. 7, 2017

(54) SYSTEM AND METHOD FOR ELECTRICAL SHORT DETECTION

(71) Applicant: General Electric Company, Schenectady, NY (US)

(72) Inventors: William James Premerlani, Scotia, NY (US); Karim Younsi, Niskayuna, NY (US); Bret Dwayne Worden, Erie, PA (US); John Krahn, Niskayuna, NY (US); Daniel Cullen, Erie, PA (US); Ajith Kuttannair Kumar, Erie, PA (US)

(73) Assignee: General Electric Company, Schenectady, NY (US)

( * ) Notice: Subject to any disclaimer, the term of this patent is extended or adjusted under 35 U.S.C. 154(b) by 78 days.

(21) Appl. No.: 14/856,945

(22) Filed: Sep. 17, 2015

(65) Prior Publication Data

US 2016/0116519 A1    Apr. 28, 2016

Related U.S. Application Data

(60) Provisional application No. 62/067,086, filed on Oct. 22, 2014.

(51) Int. Cl.
*G01R 31/02* (2006.01)
*G01R 31/00* (2006.01)
*B60L 7/02* (2006.01)

(52) U.S. Cl.
CPC ......... *G01R 31/006* (2013.01); *G01R 31/008* (2013.01); *G01R 31/025* (2013.01); *B60L 7/02* (2013.01)

(58) Field of Classification Search
USPC .................... 324/537, 73.1; 307/10.1, 142
See application file for complete search history.

(56) References Cited

U.S. PATENT DOCUMENTS

2003/0234653 A1    12/2003   Kollenda et al.
2007/0013232 A1*   1/2007    McNally ............... B60L 3/0023
                                                        307/10.1
(Continued)

FOREIGN PATENT DOCUMENTS

EP          1818207 A2     8/2007
WO       2012162091 A2    11/2012

OTHER PUBLICATIONS

Tietze et al., "Electronic Circuits-Handbook for Design and Applications", Springer 2nd Edition, pp. 1009, Jan. 1, 2008.

(Continued)

*Primary Examiner* — Vincent Q Nguyen
(74) *Attorney, Agent, or Firm* — Global Patent Operation; John A. Kramer (57) ABSTRACT

Methods and systems detect short circuits in an electrical system, such as a dynamic braking grid of a vehicle. The methods and system measure a characteristic of a current that is conducted through one or more resistive elements of an electrical system. The current is supplied to the electrical system from a power source as an applied voltage. A resistance change signal representative of a change in one or more electrical resistances of the one or more resistive elements is determined The resistance change signal can be based at least in part on a difference between the characteristic of the current that is measured and a low pass filtered value of one or more of the characteristic of the current that is measured or the applied voltage supplied by the power source. A short circuit event is identified based at least in part on the resistance change signal.

20 Claims, 4 Drawing Sheets

(56) References Cited

U.S. PATENT DOCUMENTS

2007/0229090 A1    10/2007   Kumar
2013/0054160 A1     2/2013   Younsi et al.
2013/0173183 A1     7/2013   Castillo et al.

OTHER PUBLICATIONS

European Search Report and Opinion issued in connection with corresponding EP Application No. 15190838.1 dated May 6, 2016.
Davidson, P.M.; "The Theory of the Thomson Effect in Electrical Contacts"; The Proceedings of the Institution of Electrical Engineers; vol. 96. Part I (General), No. 102. Nov. 1949.

* cited by examiner

SYSTEM AND METHOD FOR ELECTRICAL SHORT DETECTION

CROSS-REFERENCE TO RELATED APPLICATIONS

This application claims priority to U.S. Provisional Application No. 62/067,086, which was filed on 22 Oct. 2014, and the entire disclosure of which is incorporated herein by reference.

FIELD

Embodiments of the inventive subject matter described herein relate to detection of electrical shorts in electronic systems, such as power resistors.

BACKGROUND

Some known electronic systems conduct current to resistors in order to dissipate the current. For example, some vehicles include grids having conductive ribbons that receive electric power generated by motors during dynamic or regenerative braking. This electric power is generated by the motors acting to slow or stop movement of the vehicle. The electric power is conducted to the grids in order to be dissipated from dynamic braking systems of the vehicles as heat.

The grids may be formed from one or more series of resistors. These resistors may be implemented in conductive plates that are disposed relatively close together. Over time, the resistors may begin to move relative to each other due to damage to the grid, normal wear and tear, or for other reasons. If the resistors contact each other (e.g., due to vibrations or other movements), an internal electrical short between the resistors may be created. This short can damage the grid, can damage the dynamic braking system, and/or can otherwise negatively impact operation of the vehicle.

BRIEF DESCRIPTION

In one embodiment, a method (e.g., for detecting short circuits in an electrical system) includes measuring a characteristic of a current that is conducted through one or more resistive elements of an electrical system. The current is supplied to the electrical system from a power source as an applied voltage. The method also includes determining a resistance change signal representative of a change in one or more electrical resistances of the one or more resistive elements. The resistance change signal can be based at least in part on a difference between the characteristic of the current that is measured and a low pass filtered value of one or more of the characteristic of the current that is measured or the applied voltage supplied by the power source. The method also can include identifying a short circuit event based at least in part on the resistance change signal.

In another embodiment, a system (e.g., a detection system) includes a sensing apparatus and a processing assembly. The sensing apparatus is configured to measure a characteristic of a current that is conducted through one or more resistive elements of an electrical system. The current can be supplied to the electrical system from a power source as an applied voltage. The processing assembly can be configured to determine a resistance change signal representative of a change in one or more electrical resistances of the one or more resistive elements. The resistance change signal can be based at least in part on a difference between the characteristic of the current that is measured and a low pass filtered value of one or more of the characteristic of the current that is measured or the applied voltage supplied by the power source. The processing assembly also can be configured to identify a short circuit event based at least in part on the resistance change signal.

BRIEF DESCRIPTION OF THE DRAWINGS

Reference is now made briefly to the accompanying drawings, in which.

DETAILED DESCRIPTION

One or more embodiments of the inventive subject matter described herein detect electrical shorts in electronic systems. In one aspect, the systems and methods described herein can be used to detect electrical shorts in dynamic braking grids (DBGs) of vehicles, such as rail and other off-highway (OHV) vehicles. But, not all embodiments are limited to DBGs or rail vehicles. One or more embodiments may be used to detect shorts in other systems, including non-vehicle systems and vehicle systems other than rail vehicles or OHVs.

During operation of DBGs, conductive plates of the DBGs can form an electrical short that causes current in the DBGs to bypass at least some of the electrical resistance formed by the plates. The plates can form the shorts when agitated, such as by moving due to airflow generated by a blower (e.g., fan) that forces air across the plates to dissipate the heat formed by the current. But, the plates also can form the shorts due to thermal cycling of the DBGs which may cause distortions and/or dislocations of the metallic elements. These shorts can lead to localized hot spots between two or more of the plates, which can eventually grow to cause sparking, melting, arcing, and failure of the DBG.

In order to prevent failure of the DBG, systems and methods described herein can provide for the early detection of the electrical shorts. By detecting the shorts earlier, preventative inspection and maintenance can be formed, which can avoid more significant damage and/or downtime of the DBG or other electrical system.

Figure 1:
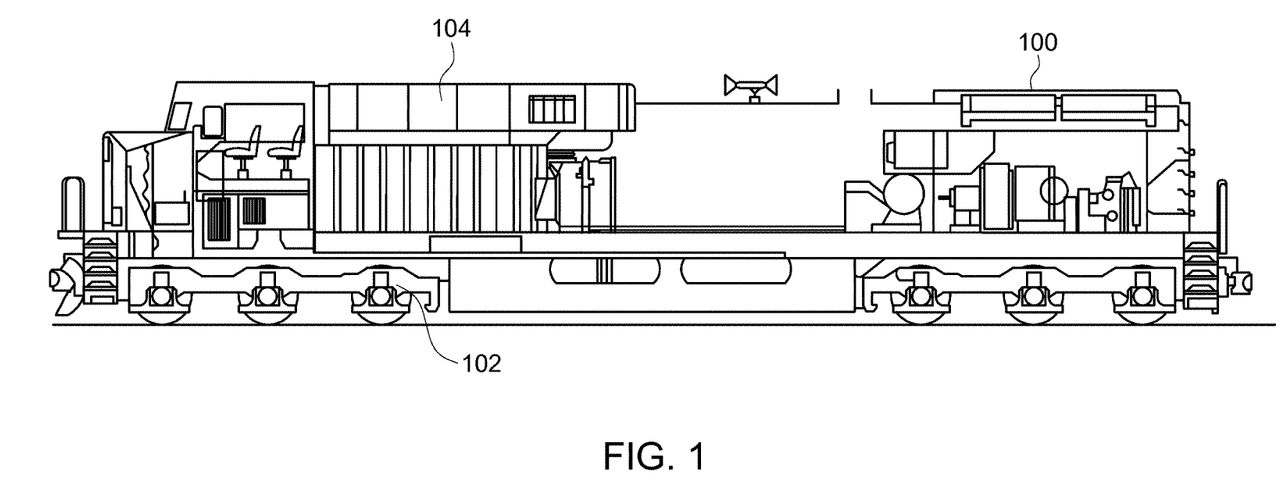
FIG. 1 illustrates a powered system according to one embodiment.

FIG. 1 illustrates a powered system 100 according to one embodiment. The powered system 100 is shown as a locomotive, but alternatively may be another type of system that is not a vehicle, or may be another type of vehicle. The system 100 includes a power source 102, such as traction motors that generate electric power during dynamic braking operation. Alternatively, the power source 102 may represent an alternator, generator, battery, or other source of electric power. The power source 102 generates the electric current, which is conducted to an electrical system 104. The electrical system 104 includes one or more resistive elements, such as power resistors. These resistive elements can convert the current from the power source 102 into heat. The heat may be dissipated from the powered system 100 by blowers (e.g., fans), for example. In the illustrated embodiment, the power source 102 may include traction motors that generate current during dynamic braking of the powered system 100. The electrical system 104 can include a DBG that converts and dissipates the electric power as heat.

Figure 2:
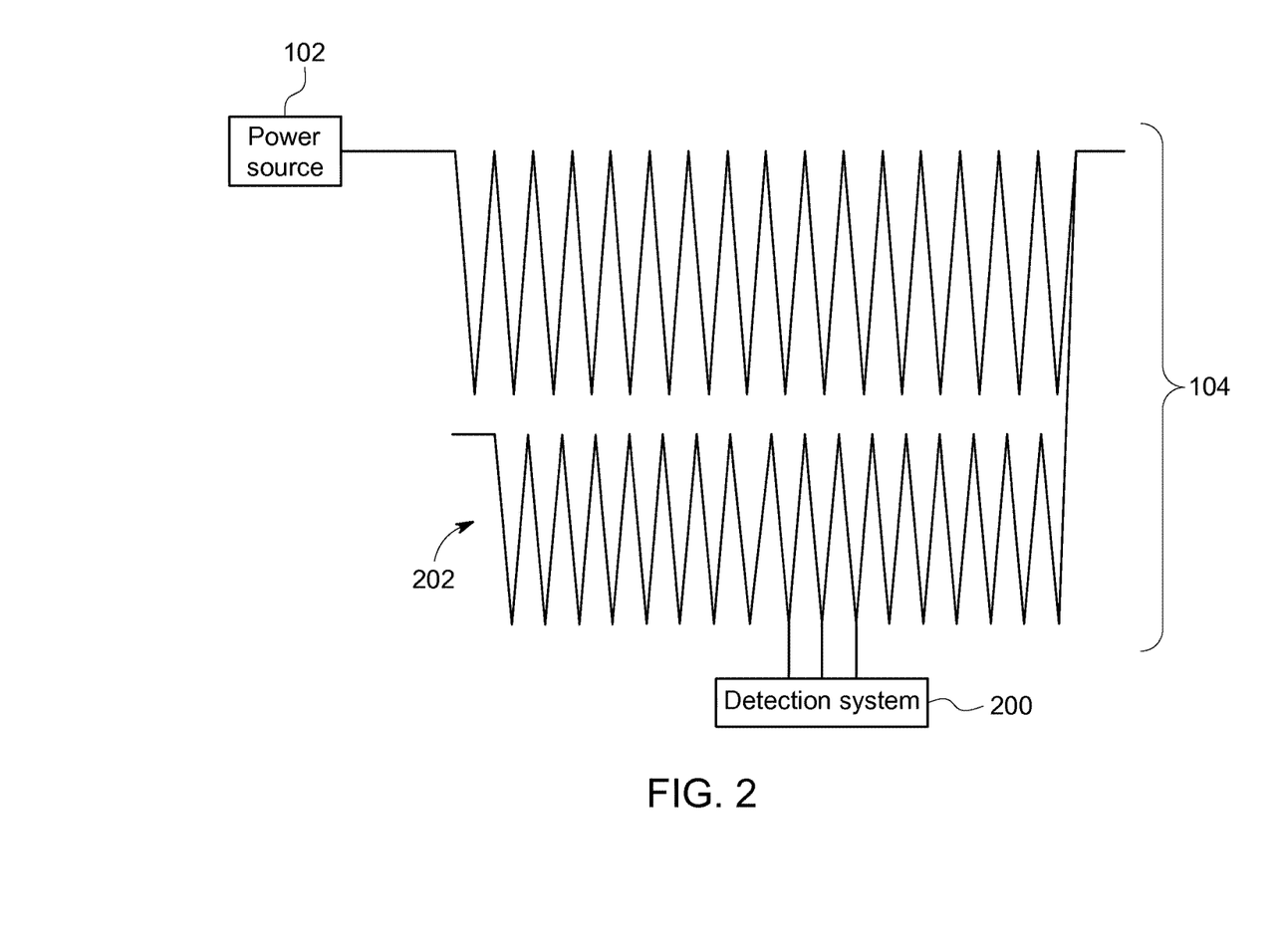
FIG. 2 illustrates a schematic diagram of an electrical system of the powered system shown in FIG. 1 and an electrical short detection system according to one embodiment.

FIG. 2 illustrates a schematic diagram of the electrical system 104 and an electrical short detection system 200 ("Detection System" in FIG. 2) according to one embodiment. The system 104 includes several electrically resistive elements 202 conductively coupled with each other in series. In the illustrated embodiment, the resistive elements 202 are conductive plates, such as conductive two-dimensional bodies that have outer dimensions that are larger in two perpendicular directions than in a third perpendicular direction. Alternatively, the resistive elements 202 may be another type of resistors. During operation of the system 104, electric power from the power source 102 is conducted through the resistive elements 202. The resistive elements 202 reduce flow of the current through the electrical system 104 and convert the electric power into heat. As one example, during dynamic braking of a vehicle, the electric power generated by traction motors of the vehicle can be conducted to the resistive elements 202 (e.g., a DBG) and dissipated as heat.

The resistive elements 202 may be spaced relatively close together. During operation, the resistive elements 202 may move due to the airflow generated by blowers and/or may warp or otherwise change shape due to the heat generated by the electric power conducted into the resistive elements 202. This movement and/or changes in shape can cause the resistive elements 202 to contact each other and form electrical shorts. The shorts can damage the powered system 100 and/or limit operation of the powered system 100.

The detection system 200 is conductively coupled with the electrical system 104 in one or more locations to monitor electrical characteristics of the current being conducted through the electrical system 104. The detection system 200 monitors changes in the electrical resistance of the electrical system 104 over time and, based on these changes, detects electrical shorts. For example, during time periods that the resistive elements 202 are not contacting each other, voltage and/or current conducted through the resistive elements 202 may be proportional to the voltage generated by the power source 102. The voltage and/or current generated by the power source 102 and conducted into the electrical system 104 may be referred to as an applied voltage ($V_{dc}$) and/or applied current, as this is the voltage or current that is applied to the resistive elements 202. The voltage and/or current conducted through the resistive elements 202 (referred to herein as conducted voltage or conducted current) may be proportional to the applied voltage and/or applied current by one or more proportionality constants. For example, the product of the conducted voltage and a proportionality constant may be equal to the input voltage and/or the product of the conducted current and the same or different proportionality constant may be equal to the input voltage. The proportionality constants may remain the same or substantially the same over time.

When two or more of the resistive elements 202 at least momentarily contact each other to form an electrical short, however, there can be a rapid variation in the proportionality constants. Therefore, sudden changes in ratios of the conducted voltages and/or conducted currents can indicate the electrical short. The detection system 200 monitors changes in the conducted voltages, conducted currents, and/or ratios of these voltages and/or currents in order to quickly identify the shorts before the shorts damage operation of the electrical system 104 and/or powered system 100.

Figure 3:
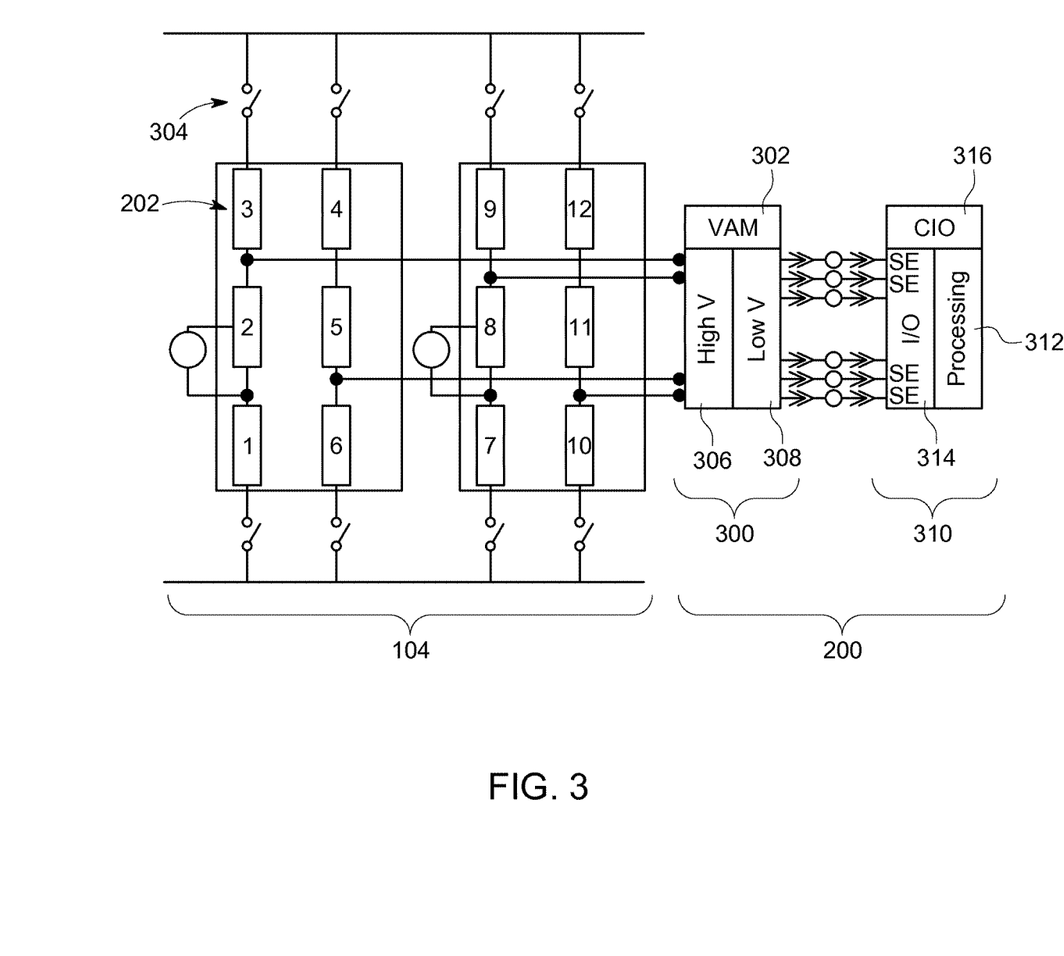
FIG. 3 is a circuit diagram of one embodiment of the electrical system shown in FIG. 1 and the detection system shown in FIG. 2.

FIG. 3 is a circuit diagram of one embodiment of the electrical system 104 and the detection system 200. Different sets of the resistive elements 202 are connected with each other in parallel, with the resistive elements 202 in the sets connected with each other in series. For example, the resistive elements 202 labeled "1", "2", and "3" may be in series with each other in a first set, the resistive elements 202 labeled "4", "5", and "6" may be in series with each other in a second set, the resistive elements 202 labeled "7", "8", and "9" may be in series with each other in a third set, and the resistive elements 202 labeled "10", "11", and "12" may be in series with each other in a fourth set, with the first, second, third, and fourth sets being parallel to each other. Switches 304 may be disposed on opposite sides of the resistive elements 202 in each set to control which resistive elements 202 receive applied current from the power source 102.

The detection system 200 includes a sensing apparatus 300 that is conductively coupled with the resistive elements 202. The sensing apparatus 300 can represent one or more devices that measure characteristics of the current supplied by the power source 102 to the electrical system 104. For example, the sensing apparatus 300 can measure the conducted voltage and/or conducted current. For example, the sensing apparatus 300 can include one or more voltage and/or current meters 302 ("VAM" in FIG. 3), high voltage filters 306 ("High V" in FIG. 3), and/or low voltage filters 308 ("Low V" in FIG. 3). The meters 302 and/or filters 306, 308 can measure the voltage between resistive elements 202 and/or the voltage drop across two or more resistive elements 202 in the locations shown in FIG. 3 and/or in other locations. Alternatively, the sensing apparatus 300 can include another type of sensor that measures the voltages and/or currents conducted between and/or through the resistive elements 202.

The detection system 200 also can include a processing assembly 310 that is operatively coupled with the sensing apparatus 300. For example, the processing assembly 310 and the sensing apparatus 300 can be connected by one or more wired and/or wireless connections. The processing assembly 310 includes hardware circuits and/or circuitry that include and/or are connected with one or more processors 312 ("Processing" in FIG. 3, e.g., microprocessors, controllers, or other electronic logic-based devices). This circuitry can include an input/output module 314 ("I/O" in FIG. 3) and an input/output board 316 ("CIO" in FIG. 3). The input/output module 314 can represent hardware circuits and/or circuitry that include and/or are connected with one or more processors that generate signals to be output for presentation to an operator (e.g., signals communicated to a display device to warn the operator of a detected short). The input/output board 316 can represent hardware circuits and/or circuitry that include and/or are connected with one or more processors for communicating the signals to the display device or other output device. Optionally, the input/output board 316 can receive signals input from one or more other devices, such as signals representative of the applied voltage generated by the power source 102 and conducted to the electrical system 104.

Figure 4:
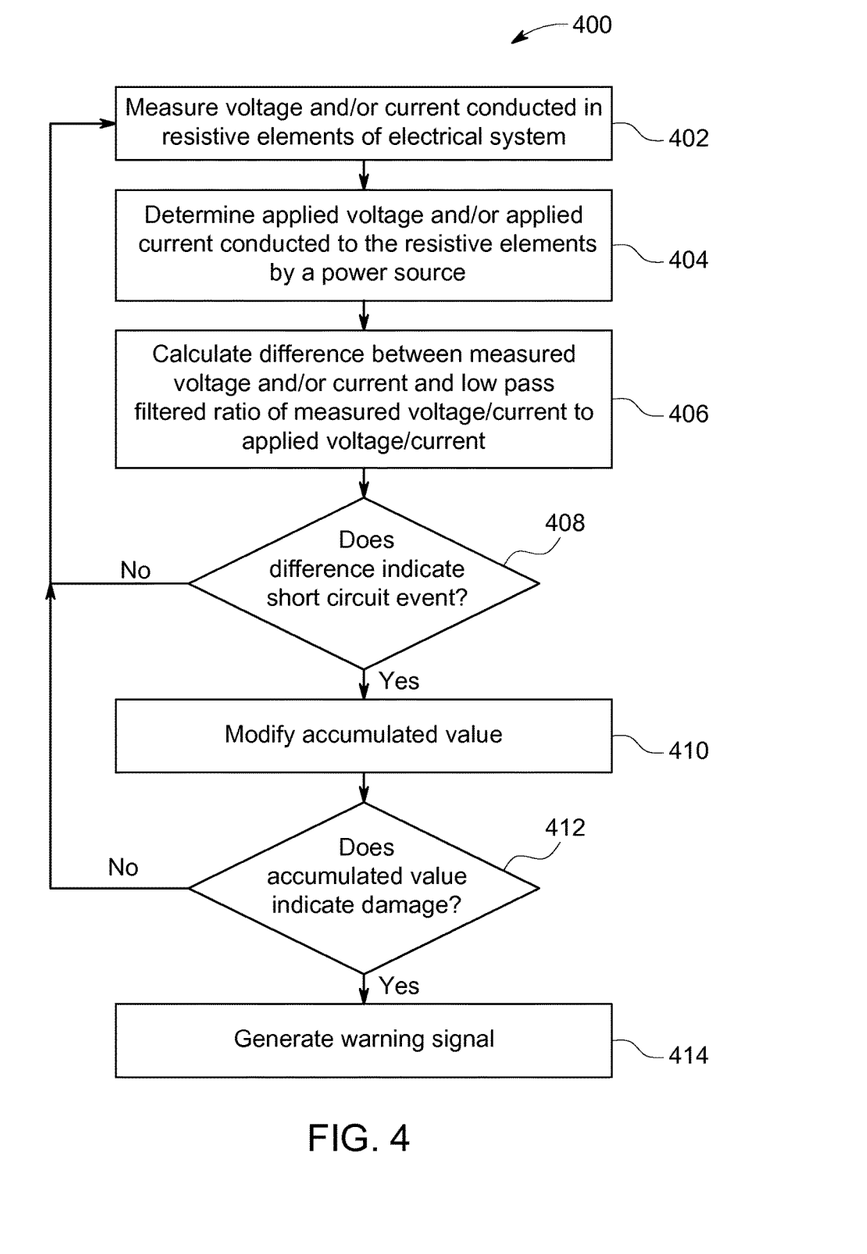
FIG. 4 is a flowchart of one embodiment of a method for detecting short circuit events.

FIG. 4 is a flowchart of one embodiment of a method 400 for detecting short circuit events. The method 400 may be performed by the detection system 300 in one embodiment. At 402, the conducted voltage and conducted current is measured by the sensing apparatus 300. At 404, the applied voltage and/or applied current supplied by the power source 102 to the electrical system 104 are determined For example, the sensing apparatus 300 may be connected with the electrical system 104 in one or more other locations to measure the applied voltage from the power source 102.

At 406, differences between the measured voltages and/or currents (e.g., the conducted voltage and/or conducted current) and filtered ratios of the measured voltages and/or currents to the applied voltages and/or currents are calculated. These differences can be referred to as resistance change signals.

The processing assembly 310 can calculate ratios of the conducted voltages and/or conducted currents to determine proportionality constants of the electrical system 104. For example, the processing assembly 310 can divide the conducted voltage measured between the second and third resistive elements 202 (e.g., elements "2" and "3" in FIG. 3) by the conducted voltage measured between the fifth and sixth resistive elements 202 (e.g., elements "5" and "6" in FIG. 3), between the eighth and ninth resistive elements 202 (e.g., elements "8" and "9" in FIG. 3), between the tenth and eleventh resistive elements 202 (e.g., elements "10" and "11" in FIG. 3), or between another pair of resistive elements 202. Additional ratios can be measured to calculate additional proportionality constants of the electrical system 104.

During normal operation (e.g., in the absence of a short circuit), the constants of proportionality remain the same or substantially the same (e.g., do not vary by a designated threshold, such as 1%, 3%, 5%, or another value). Over time, however, the resistances provided by the resistive elements 202 can change slowly with respect to time. As a result, the constants of proportionality can change slowly with respect to time. The constants of proportionality can be referred to as a resistance change signal. Under normal conditions (e.g., in the absence of a short circuit), the changes in the constants of proportionality may include only noise and not actual changes in the constants of proportionality. A short circuit can occur during a contact event between two or more of the resistive elements 202. During such a contact event, the resistance change signal can increase above the noise and represent a short circuit.

In one embodiment, the processing assembly 310 can calculate a resistance change signal from the applied voltage and the conducted voltage. Alternatively, the resistance change signal can be calculated from the applied current and the conducted current. While the description herein focuses on calculating the resistance change signals from voltages, not all embodiments are limited to using voltages.

One example of a resistance change signal that can be calculated by the processing assembly 310 is a ratio deviation signal. In one embodiment, the processing assembly 310 calculates the ratio deviation signal as follows:

$$RatioDeviation(t) = \frac{V_{grid}(t)}{V_{base}(t)} - \left\langle \frac{V_{grid}(t)}{V_{base}(t)} \right\rangle \qquad \text{(Equation \#1)}$$

where RatioDeviation(t) represents the ratio deviation signal, $V_{grid}(t)$ represents the voltage across the electrical system 104 or grid (e.g., the conducted voltage), $V_{base}(t)$ represents the applied voltage or base voltage, or the applied voltage divided by a constant, such as six or another number, and $$\left\langle \frac{V_{grid}(t)}{V_{base}(t)} \right\rangle$$

represents low pass filtering of $$\frac{V_{grid}(t)}{V_{base}(t)}.$$

The low pass filtering of values of $$\frac{V_{grid}(t)}{V_{base}(t)}$$

can discard changes in $$\frac{V_{grid}(t)}{V_{base}(t)}$$

that occur over a shorter time period than a designated time period. For example, an increase or decrease in $$\frac{V_{grid}(t)}{V_{base}(t)}$$

that begins and ends within 100 milliseconds, 50 milliseconds, 0.1 second, or another time period, may be ignored while increases or decreases in $$\frac{V_{grid}(t)}{V_{base}(t)}$$

that last for longer than the designated time period are used as the values of $$\left\langle \frac{V_{grid}(t)}{V_{base}(t)} \right\rangle.$$

The value of $$\left\langle \frac{V_{grid}(t)}{V_{base}(t)} \right\rangle$$

can be used as a baseline or expected value for the ratio deviation signal. During time periods that the proportionality constants do not change significantly, the values of $$\frac{V_{grid}(t)}{V_{base}(t)} \text{ and } \left\langle \frac{V_{grid}(t)}{V_{base}(t)} \right\rangle$$

are closer in value and, as a result, the ratio deviation signal is smaller or zero. But, during time periods that the proportionality constants do change significantly, the values of $$\frac{V_{grid}(t)}{V_{base}(t)} \text{ and } \left\langle \frac{V_{grid}(t)}{V_{base}(t)} \right\rangle$$

are farther apart in value and, as a result, the ratio deviation signal is larger.

Another example of a resistance change signal that can be calculated by the processing assembly 310 is a voltage deviation signal. In one embodiment, the processing assembly 310 calculates the voltage deviation signal as follows:

$$VoltageDeviation(t) = V_{grid}(t) - \left(\frac{V_{grid}(t)}{V_{base}(t)}\right) \cdot V_{base}(t) \quad \text{(Equation \#2)}$$

where VoltageDeviation(t) represents the voltage deviation signal.

Another example of a resistance change signal that can be calculated by the processing assembly 310 is a squared deviation signal as follows:

$$VoltageSquaredDeviation(t) = V_{grid}(t) \cdot \langle V_{base}(t) \rangle - V_{base}(t) \cdot \langle V_{grid}(t) \rangle \quad \text{(Equation \#3)}$$

where VoltageSquaredDeviation(t) represents the squared deviation signal, $\langle V_{base}(t) \rangle$ represents low pass filtering of $V_{base}(t)$, and $\langle V_{grid}(t) \rangle$ represents low pass filtering of $V_{grid}(t)$.

At 408, a determination is made as to whether the differences between the measured voltages and/or currents (e.g., the conducted voltage and/or conducted current) and filtered ratios of the measured voltages and/or currents to the applied voltages and/or currents indicate a short circuit event. For example, the processing assembly 310 can examine the resistance change signals to identify short circuit events.

With respect to the ratio deviation signal (RatioDeviation(t)) described above, a short circuit event may be identified responsive to the absolute value of the ratio deviation signal exceeding a threshold value (K). The threshold value can be selected to change the sensitivity of the detection system 200. For example, the detection system 200 may be more sensitive to short circuits, but also more likely to incorrectly identify short circuit events, with lower values of the threshold value (K), but the detection system 200 can be less sensitive to short circuits, but less likely to incorrectly identify short circuit events, with larger values of the threshold value (K).

With respect to the voltage deviation signal (VoltageDeviation(t)) described above, a short circuit event can be identified by the processing assembly 312 monitoring the values of the voltage deviation signal. For example, a short circuit event may be identified responsive to the absolute value of the voltage deviation signal exceeding a product of the threshold value (K) and $V_{base}(t)$.

With respect to the squared deviation signal (VoltageSquaredDeviation(t)) described above, a short circuit event can be identified by the processing assembly 312 monitoring the values of the squared deviation signal. For example, a short circuit event may be identified responsive to the absolute value of the squared deviation signal exceeding a product of the threshold value (K), $V_{base}(t)$, and $\langle V_{base}(t) \rangle$.

If a short circuit event is detected, then flow of the method 400 can proceed to 410. Otherwise, flow of the method 400 can return to 402 for additional monitoring of the electrical system 104. At 410, an accumulated value of the short circuit event(s) is modified. For example, in contrast to determining that a short circuit event has occurred each time the resistance change signals indicate a short circuit event, the processing assembly 310 can track an accumulated value that changes value based on the number, duration, and/or energy of the short circuit events.

As one example, the processing assembly 310 can calculate the accumulated value of the short circuit events as a total number of the short circuit events. Increasing values of such an accumulated value can be indicative of increased severity of the short circuit event.

As another example, the processing assembly 310 can calculate the accumulated value as a total time duration of the short circuit events. For example, the total time period that the resistance change signals exceed one or more of the thresholds described above can be calculated as the accumulated value. If a short circuit event lasts for one second, a subsequent short circuit event lasts for a half second, and another short circuit event lasts for two seconds, then the total time periods of the short circuit events can be three and a half seconds. Increasing total time periods can indicate increasing damage to the resistive elements 202 relative to shorter total time periods. The total time periods may be re-set to zero, such as after a trip of the powered system 100 from a beginning location to destination location.

As another example, the processing assembly 310 can calculate the accumulated value an energy of a short circuit event. For example, the processing assembly 310 can calculate the accumulated value as a time integral of the squared deviation signal during detection of a short circuit event. This accumulated value can be indicative of and/or proportional to the amount of thermal energy or heat going into a point of contact between the resistive elements 202 where the short circuit event is taking place.

At 412, a determination is made as to whether the accumulated value indicates that the electrical system 104 is damaged (and therefore generating the short circuit events). In one embodiment, the processing assembly 310 can compare one or more of these accumulated values with an associated designated threshold. If the accumulated value exceeds the threshold, the processing assembly 310 can determine that the electrical system 104 is likely damaged. As a result, flow can continue to 414. Otherwise, flow of the method 400 can return to 402.

At 414, a warning signal is generated. This warning signal can be generated by the processing assembly 310 and presented to an operator of the powered system 100. The warning signal may indicate to the operator that the electrical system 104 is in the early stage of damage, such as exfoliation. In one aspect, the accumulated value can be compared to several different thresholds representative of different levels of damage (e.g., various stages of exfoliation). The thresholds can be determined through testing of electrical systems 104 to destruction while measuring the above quantities, and then setting the thresholds based on engineering judgment. The warning signal may be used to control operations of the powered system 100. For example, the warning signal may cause the powered system 100 to be deactivated, to reduce power output, or otherwise decrease the operations of the powered system 100 to avoid further damage to the electrical system 104.

The method 400 may be repeated one or more times during operation of the powered system 100. For example, flow of the method 400 may return to 402 for additional monitoring of the electrical system 104.

In one embodiment, a method (e.g., for detecting short circuits in an electrical system) includes measuring a characteristic of a current that is conducted through one or more resistive elements of an electrical system. The current is supplied to the electrical system from a power source as an applied voltage. The method also includes determining a resistance change signal representative of a change in one or more electrical resistances of the one or more resistive elements. The resistance change signal can be based at least in part on a difference between the characteristic of the current that is measured and a low pass filtered value of one or more of the characteristic of the current that is measured or the applied voltage supplied by the power source. The method also can include identifying a short circuit event based at least in part on the resistance change signal.

In one aspect, the applied voltage can be generated by a traction motor of a vehicle during dynamic braking of the vehicle, the one or more resistive elements can include one or more resistors of a dynamic braking grid, and/or the conducted voltage can include a voltage drop across the one or more resistors.

In one aspect, the resistance change signal can represent the change in the one or more electrical resistances caused by an increase in heat in the one or more resistive elements due to the short circuit event.

In one aspect, the characteristic of the current that is measured can include a voltage drop across at least one of the resistive elements.

In one aspect, the resistance change signal can represent a difference between a ratio of the voltage drop across the at least one of the resistive elements to the applied voltage and a low pass filtered value of the ratio of the voltage drop across the at least one of the resistive elements to the applied voltage.

In one aspect, the short circuit event can be identified responsive to an absolute value of the resistance change signal exceeding a designated, non-zero threshold.

In one aspect, the resistance change signal can represent a difference between the voltage drop across the at least one of the resistive elements and a product of the applied voltage and a low pass filtered value of a ratio of the voltage drop across the at least one of the resistive elements to the applied voltage.

In one aspect, the short circuit event can be identified responsive to an absolute value of the resistance change signal exceeding a product of the applied voltage and a designated, non-zero threshold.

In one aspect, the resistance change signal can represent a difference between a first product of the voltage drop across the at least one of the resistive elements and a low pass filtered value of the applied voltage and a second product of the applied voltage and a low pass filtered value of the voltage drop across the at least one of the resistive elements.

In one aspect, the short circuit event can be identified responsive to an absolute value of the resistance change signal exceeding a product of the applied voltage, the voltage drop across the at least one resistive element, and a designated, non-zero threshold.

In one aspect, the method also can include monitoring a number of times that the short circuit event is identified and generating a warning signal representative of damage to the electrical system responsive to the number of times that the short circuit event is identified exceeding a designated, non-zero threshold.

In one aspect, the method also can include monitoring a total time period duration of the short circuit events and generating a warning signal representative of damage to the electrical system responsive to the total time duration exceeding a designated, non-zero threshold.

In one aspect, the method also can include monitoring a time integral of the resistance change signal and generating a warning signal representative of damage to the electrical system responsive to the time integral exceeding a designated, non-zero threshold.

In one aspect, the method also can include generating a warning signal based at least in part on identifying the short circuit event. The warning signal can indicate damage to the electrical system to an operator of a powered system that includes the electrical system.

In another embodiment, a system (e.g., a detection system) includes a sensing apparatus and a processing assembly. The sensing apparatus is configured to measure a characteristic of a current that is conducted through one or more resistive elements of an electrical system. The current can be supplied to the electrical system from a power source as an applied voltage. The processing assembly can be configured to determine a resistance change signal representative of a change in one or more electrical resistances of the one or more resistive elements. The resistance change signal can be based at least in part on a difference between the characteristic of the current that is measured and a low pass filtered value of one or more of the characteristic of the current that is measured or the applied voltage supplied by the power source. The processing assembly also can be configured to identify a short circuit event based at least in part on the resistance change signal.

In one aspect, the applied voltage can be generated by a traction motor of a vehicle during dynamic braking of the vehicle, the one or more resistive elements can include one or more resistors of a dynamic braking grid, and the conducted voltage can include a voltage drop across the one or more resistors.

In one aspect, the resistance change signal can represent the change in the one or more electrical resistances caused by an increase in heat in the one or more resistive elements due to the short circuit event.

In one aspect, the characteristic of the current that is measured can include a voltage drop across at least one of the resistive elements.

In one aspect, the resistance change signal can represent a difference between a ratio of the voltage drop across the at least one of the resistive elements to the applied voltage and a low pass filtered value of the ratio of the voltage drop across the at least one of the resistive elements to the applied voltage.

In one aspect, the processing assembly can be configured to identify the short circuit event responsive to an absolute value of the resistance change signal exceeding a designated, non-zero threshold.

In one aspect, the resistance change signal can represent a difference between the voltage drop across the at least one of the resistive elements and a product of the applied voltage and a low pass filtered value of a ratio of the voltage drop across the at least one of the resistive elements to the applied voltage.

In one aspect, the processing assembly can be configured to identify the short circuit event responsive to an absolute value of the resistance change signal exceeding a product of the applied voltage and a designated, non-zero threshold.

In one aspect, the resistance change signal can represent a difference between a first product of the voltage drop across the at least one resistive element and a low pass filtered value of the applied voltage and a second product of the applied voltage and a low pass filtered value of the voltage drop across the at least one resistive element.

In one aspect, the processing assembly can be configured to identify the short circuit event responsive to an absolute value of the resistance change signal exceeding a product of the applied voltage, the voltage drop across the at least one resistive element, and a designated, non-zero threshold.

In one aspect, the processing assembly can be configured to monitor a number of times that the short circuit event is identified and to generate a warning signal representative of damage to the electrical system responsive to the number of times that the short circuit event is identified exceeding a designated, non-zero threshold.

In one aspect, the processing assembly can be configured to monitor a total time period duration of the short circuit events and to generate a warning signal representative of damage to the electrical system responsive to the total time duration exceeding a designated, non-zero threshold.

In one aspect, the processing assembly can be configured to monitor a time integral of the resistance change signal and to generate a warning signal representative of damage to the electrical system responsive to the time integral exceeding a designated, non-zero threshold.

In one aspect, the processing assembly can be configured to generate a warning signal based at least in part on identifying the short circuit event. The warning signal can indicate damage to the electrical system to an operator of a powered system that includes the electrical system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose several embodiments of the inventive subject matter and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose message processor, microcontroller, random access memory, hard disk, and the like). Similarly, the programs may be standalone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A method comprising:
    measuring a characteristic of a current that is supplied to an electrical system from a power source as an applied voltage and that is conducted through one or more resistive elements of the electrical system;
    determining a resistance change of the one or more resistive elements based at least in part on a difference between the characteristic of the current that is measured and a filtered value of one or more of the characteristic of the current that is measured or the applied voltage supplied by the power source; and
    identifying a short circuit event based at least in part on the resistance change;
    wherein the characteristic of the current that is measured is a voltage drop across at least one of the one or more resistive elements; and
    wherein the resistance change represents a difference between a ratio of the voltage drop across the at least one of the one or more resistive elements to the applied voltage and a filtered value of the ratio of the voltage drop across the at least one of the one or more resistive elements to the applied voltage.

2. The method of claim 1, wherein the applied voltage is generated by a traction motor of a vehicle during dynamic braking of the vehicle, the one or more resistive elements include one or more resistors of a dynamic braking grid, and the applied voltage is a voltage drop across the one or more resistive elements.

3. The method of claim 1, wherein the short circuit event is identified responsive to the resistance change exceeding a designated, non-zero threshold.

4. The method of claim 1, wherein the electrical system is a dynamic braking grid.

5. A method comprising:
    measuring a characteristic of a current that is supplied to an electrical system from a power source as an applied voltage and that is conducted through one or more resistive elements of the electrical system;
    determining a resistance change of the one or more resistive elements based at least in part on a difference between the characteristic of the current that is measured and a filtered value of one or more of the characteristic of the current that is measured or the applied voltage supplied by the power source; and identifying a short circuit event based at least in part on the resistance change;

wherein the characteristic of the current that is measured is a voltage drop across at least one of the one or more resistive elements; and wherein the resistance change represents a difference between the voltage drop across the at least one of the one or more resistive elements and a product of the applied voltage and a filtered value of a ratio of the voltage drop across the at least one of the one or more resistive elements to the applied voltage.

6. The method of claim 5, wherein the short circuit event is identified responsive to the resistance change exceeding a product of the applied voltage and a designated, non-zero threshold.

7. A method comprising:

measuring a characteristic of a current that is supplied to an electrical system from a power source as an applied voltage and that is conducted through one or more resistive elements of the electrical system;

determining a resistance change of the one or more resistive elements based at least in part on a difference between the characteristic of the current that is measured and a filtered value of one or more of the characteristic of the current that is measured or the applied voltage supplied by the power source; and identifying a short circuit event based at least in part on the resistance change;

wherein the characteristic of the current that is measured is a voltage drop across at least one of the one or more resistive elements; and wherein the resistance change represents a difference between a first product of the voltage drop across the at least one of the one or more resistive elements and a first filtered value of the applied voltage and a second product of the applied voltage and a second filtered value of the voltage drop across the at least one of the one or more resistive elements.

8. The method of claim 7, wherein the electrical system is a dynamic braking grid.

9. A method comprising:

measuring a characteristic of a current that is supplied to an electrical system from a power source as an applied voltage and that is conducted through one or more resistive elements of the electrical system;

determining a resistance change of the one or more resistive elements based at least in part on a difference between the characteristic of the current that is measured and a filtered value of one or more of the characteristic of the current that is measured or the applied voltage supplied by the power source;

identifying a short circuit event based at least in part on the resistance change;

monitoring one or more of a number of times that the short circuit event is identified, a total time period duration of the short circuit events, or a time integral of the resistance change; and generating a warning signal representative of damage to the electrical system responsive to one or more of the number of times that the short circuit event is identified exceeding a first designated, non-zero threshold, the total time duration exceeding a second designated, non-zero threshold, or the time integral exceeding a third designated, non-zero threshold.

10. The method of claim 9, wherein the electrical system is a dynamic braking grid.

11. A system comprising:

a sensing apparatus configured to measure a characteristic of a current supplied to an electrical system from a power source as an applied voltage and conducted through one or more resistive elements of the electrical system; and a processing assembly configured to determine a resistance change representative of a change in one or more electrical resistances of the one or more resistive elements, the resistance change based at least in part on a difference between the characteristic of the current that is measured and a filtered value of one or more of the characteristic of the current that is measured or the applied voltage supplied by the power source, wherein the processing assembly also is configured to identify a short circuit event based at least in part on the resistance change;

wherein the sensing apparatus is configured to measure a voltage drop across at least one of the one or more resistive elements as the characteristic of the current; and wherein the sensing apparatus is configured to measure the resistance change as one or more of:

a difference between a ratio of the voltage drop across the at least one of the one or more resistive elements to the applied voltage and a filtered value of the ratio of the voltage drop across the at least one of the one or more resistive elements to the applied voltage;

a difference between the voltage drop across the at least one of the one or more resistive elements and a product of the applied voltage and a filtered value of a ratio of the voltage drop across the at least one of the one or more resistive elements to the applied voltage; or a difference between a first product of the voltage drop across the at least one of the one or more resistive elements and a filtered value of the applied voltage and a second product of the applied voltage and a low pass filtered value of the voltage drop across the at least one of the one or more resistive elements.

12. The system of claim 11, wherein the applied voltage is generated by a traction motor of a vehicle during dynamic braking of the vehicle, the one or more resistive elements include one or more resistors of a dynamic braking grid, and the conducted voltage is a voltage drop across the one or more resistors.

13. The system of claim 11, wherein the electrical system is a dynamic braking grid.

14. A system comprising:

a sensing apparatus configured to measure a characteristic of a current supplied to an electrical system from a power source as an applied voltage and conducted through one or more resistive elements of the electrical system; and a processing assembly configured to determine a resistance change representative of a change in one or more electrical resistances of the one or more resistive elements, the resistance change based at least in part on a difference between the characteristic of the current that is measured and a filtered value of one or more of the characteristic of the current that is measured or the applied voltage supplied by the power source, wherein the processing assembly also is configured to identify a short circuit event based at least in part on the resistance change;

wherein the processing assembly is configured to monitor one or more of a number of times that the short circuit event is identified, a total time period duration of the short circuit events, or a time integral of the resistance change, and to generate a warning signal representative of damage to the electrical system responsive to one or more of the number of times that the short circuit event is identified exceeding a designated, non-zero threshold, the total time duration exceeding a designated, non-zero threshold, or the time integral exceeding a designated, non-zero threshold.

15. The system of claim 14, wherein the electrical system is a dynamic braking grid.

16. A system comprising:
a sensing apparatus configured to measure a characteristic of a current supplied to an electrical system of a vehicle from a traction motor of the vehicle as an applied voltage and conducted through one or more resistors of the electrical system; and
a processing assembly configured to determine a resistance change representative of a change in one or more electrical resistances of the one or more resistors of the electrical system, the resistance change based at least in part on a difference between the characteristic of the current that is measured and a low pass filtered value of one or more of the characteristic of the current that is measured or the applied voltage supplied by the traction motor, wherein the processing assembly also is configured to identify an increase in heat of the electrical system representative of a short circuit event in the electrical system based at least in part on the resistance change;
wherein the sensing apparatus is configured to measure a voltage drop across at least one of the one or more resistors as the characteristic of the current; and
wherein the sensing apparatus is configured to measure the resistance change as one or more of:
a difference between a ratio of the voltage drop across the at least one of the one or more resistors to the applied voltage and a low pass filtered value of the ratio of the voltage drop across the at least one of the one or more resistors to the applied voltage;
a difference between the voltage drop across the at least one of the one or more resistors and a product of the applied voltage and a low pass filtered value of a ratio of the voltage drop across the at least one of the one or more resistors to the applied voltage; or
a difference between a first product of the voltage drop across the at least one of the one or more resistors and a filtered value of the applied voltage and a second product of the applied voltage and a low pass filtered value of the voltage drop across the at least one of the one or more resistors.

17. The system of claim 16, wherein the processing assembly is configured to identify the increase in heat responsive to an absolute value of the resistance change exceeding one or more of a product of the applied voltage and a designated, non-zero threshold, or a product of the applied voltage, the voltage drop across the at least one of the one or more resistors, and the designated, non-zero threshold.

18. The system of claim 16, wherein the electrical system is a dynamic braking grid.

19. A system comprising:
a sensing apparatus configured to measure a characteristic of a current supplied to an electrical system of a vehicle from a traction motor of the vehicle as an applied voltage and conducted through one or more resistors of the electrical system; and
a processing assembly configured to determine a resistance change representative of a change in one or more electrical resistances of the one or more resistors of the electrical system, the resistance change based at least in part on a difference between the characteristic of the current that is measured and a low pass filtered value of one or more of the characteristic of the current that is measured or the applied voltage supplied by the traction motor, wherein the processing assembly also is configured to identify an increase in heat of the electrical system representative of a short circuit event in the electrical system based at least in part on the resistance change;
wherein the processing assembly is configured to monitor one or more of a number of times that the short circuit event is identified, a total time period duration of the short circuit events, or a time integral of the resistance change, and to generate a warning signal representative of damage to the electrical system responsive to one or more of the number of times that the short circuit event is identified exceeding a designated, non-zero threshold, the total time duration exceeding a designated, non-zero threshold, or the time integral exceeding a designated, non-zero threshold.

20. The system of claim 19, wherein the electrical system is a dynamic braking grid.

* * * * *